United States Patent
Triebe et al.

(10) Patent No.: US 6,204,665 B1
(45) Date of Patent: Mar. 20, 2001

(54) NMR PROBE HEAD WITH INTEGRATED REMOTE TUNING

(75) Inventors: René Triebe, Zärich; Jürg Fenner, Dübendorf; Oskar Schett, Uster, all of (CH)

(73) Assignee: Bruker AG, Fällanden (CH)

( * ) Notice: Subject to any disclaimer, the term of this patent is extended or adjusted under 35 U.S.C. 154(b) by 0 days.

(21) Appl. No.: 09/161,298

(22) Filed: Sep. 28, 1998

(30) Foreign Application Priority Data

Oct. 10, 1997 (DE) .............................................. 197 44 763

(51) Int. Cl.⁷ .............................. G01R 33/20; G01V 3/00
(52) U.S. Cl. ............................................. 324/318; 324/321
(58) Field of Search ..................................... 324/300–322

(56) References Cited

U.S. PATENT DOCUMENTS

| | | | |
|---|---|---|---|
| 4,698,595 | * 10/1987 | Roschmann | 324/313 |
| 4,837,516 | * 6/1989 | Takahashi | 324/322 |
| 4,902,975 | * 2/1990 | Kess | 324/318 |
| 5,247,330 | * 9/1993 | Rindlisbacher et al. | 324/307 |

FOREIGN PATENT DOCUMENTS

| | | |
|---|---|---|
| 34 21 830 | 12/1985 | (DE) . |
| 3421830 | 12/1985 | (DE) . |
| 38 25 525 | 2/1989 | (DE) . |
| 0 136 642 | 4/1985 | (EP) . |
| 0 518 100 | 12/1992 | (EP) . |
| 0518100 | 12/1992 | (EP) . |
| 276 239 | 12/1993 | (JP) . |
| 63 200 742 | 8/1998 | (JP) . |

* cited by examiner

Primary Examiner—Christine Oda
Assistant Examiner—Tiffany A. Fetzner
(74) Attorney, Agent, or Firm—Paul Vincent

(57) ABSTRACT

A nuclear magnetic resonance (NMR) spectrometer probe head having one or more drive units, one or more transmission units and one or more drive shafts which are coupled to adjustment rods and a means for directly mounting and fastening the drive unit, transmission unit, and drive shaft to the lower portion of the probe head during operation of the NMR spectrometer, which increases user comfort and freedom of motion below the magnet. The probe head also having an actuator for remote control adjustment of electrical and/or mechanical units, e.g. trimmer capacitors, variable resistors, and adjustable inductors within the probe head. The probe head is characterized in that the amount of space needed for the actuator is minimized, access to the region below the magnet is optimized, and installation of the actuator is simplified because the actuator is an integral part of the NMR-probe head within an NMR-spectrometer.

9 Claims, 4 Drawing Sheets

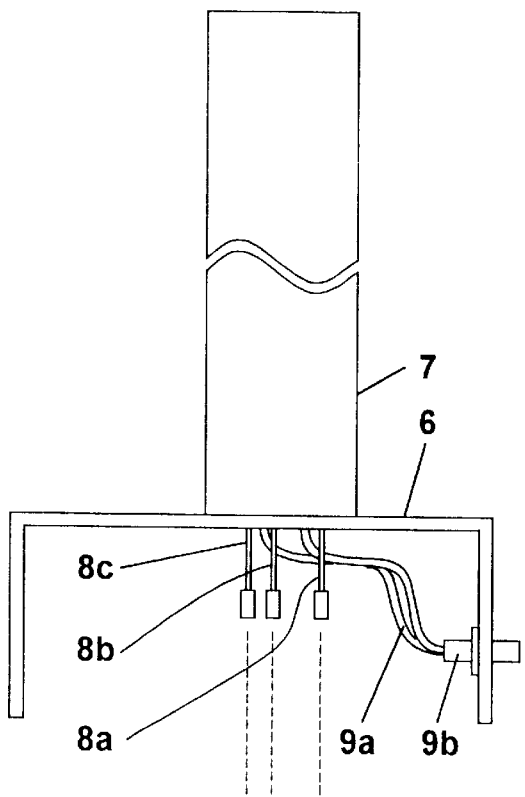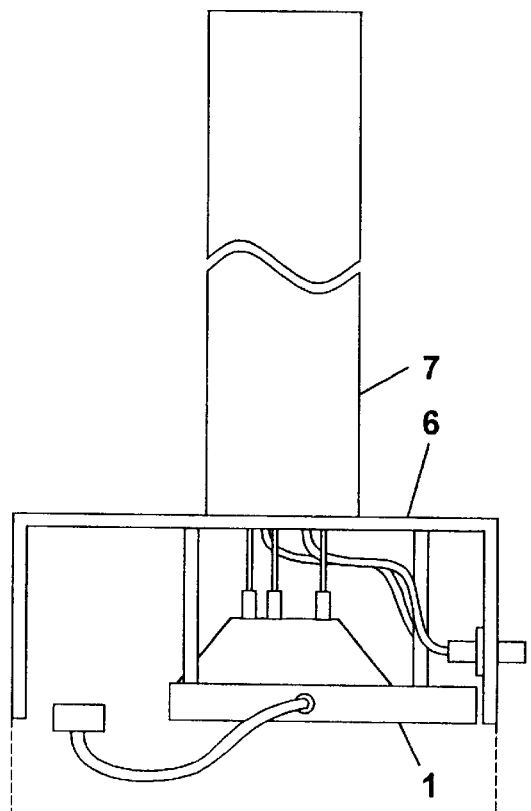
Fig. 1a
Fig. 1c
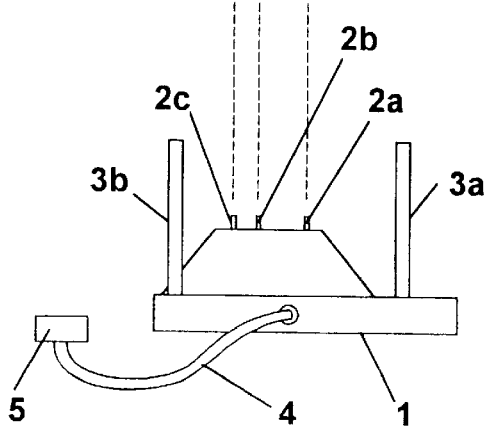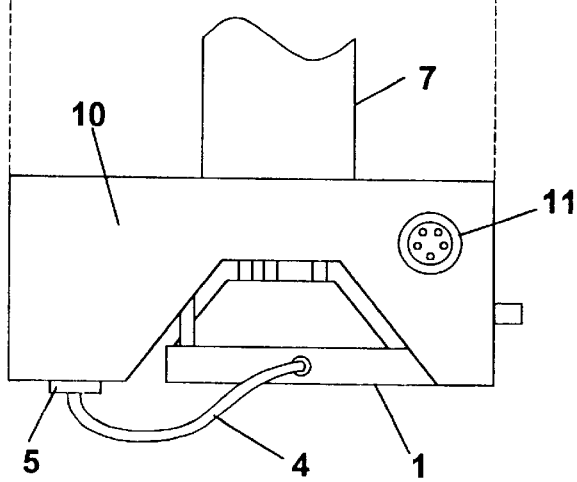
Fig. 1b
Fig. 1d

PRIOR ART

NMR PROBE HEAD WITH INTEGRATED REMOTE TUNING

This application claims Paris Convention priority of German patent application 197 44 763.5 filed Oct. 10, 1997, the complete disclosure of which is hereby incorporated by reference.

BACKGROUND OF THE INVENTION

The invention a probe head having concerns an actuator for remote adjustment of electrical and/or mechanical units, e.g. trimming capacitors, variable resistors, adjustable inductors etc. in a probe head of a nuclear magnetic resonance (NMR) spectrometer having one or more drive units, one or more transmission units as well as one or more drive shafts which couple to probe head adjustment rods.

An actuator of this kind is e.g. known in the art from EP 0 518 100 B1.

Modern nuclear magnetic resonance (NMR) spectrometers normally have a powerful computer which controls all important adjustments and parameters of the spectrometer.

The spectrometer user sits at a console and issues instructions and optimization adjustments directly to the computer. This is done with the assistance of a monitor, a mouse, a computer key board as well as possible additional input apparatus having keys and nobs to transfer special requests. The computer then passes these directions in a suitable form to the corresponding electronic units of the spectrometer.

As long as the user carries out measurements on the same sample, this user-friendly function is available to him. However, if the user wants to use a new sample, it is necessary for him to leave his working area in order to introduce a new sample into the magnet. If this new sample has a dielectric constant or electric conductivity which is different than the previous one, then it is necessary for the user to manually readjust the resonance frequency as well as the impedance matching of the NMR receiver resonator at the probe head location, i.e. at the magnet. Impedance matching refers to electrical adjustment of the resonator to the RF cable and the downstream preamplifier so that maximum signal energy reaches the preamplifier.

In order to improve user friendliness, units have been developed, so-called sample changers, which facilitate a remote control changing of a large number of samples (e.g. 60 individual samples). Remote-controlled electromagnetic units, so-called actuators, have also been developed by means of which both the trimming capacitor as well as fixed capacitances in the probe head can be adjusted, added or switched-out (see EP 0 518 100 B1). In this manner, it is possible to also remotely control the resonance frequency and the impedance matching of the NMR resonator.

The use of sample changers and actuators allows for the full automatic operation of the spectrometer during long periods of time and using different samples. The computer then receives a schedule of requests which it transfers into directions for adjustment of the various hardware components. The computer instructs e.g. the sample changer to introduce a particular sample into the magnet. Towards this end, pressurized air must first be switched-on within the bore 30 (see FIG. 4) so that the sample can be transferred on an air cushion from the upper end of the bore 30 down into the region of the magnetic center 32. The air pressure must thereby be regulated in such a fashion that the sample does not travel too rapidly in a downward direction, since otherwise it could be damaged. As soon as the sample has reached its end position, the pressurized air must once more be switched-off. The pressure from a second pressurized air lead which serves for driving the air turbine of the sample is subsequently regulated in such a fashion that the sample rotates at the desired frequency. All these processes proceed automatically. In addition, the computer instructs the actuator to change the capacitors in such a fashion that an optimum adjustment of the resonance frequency and impedance matching of the NMR resonator is effected. The prescribed measurement is subsequently started. This measurement can vary from sample to sample. Such a measurement procedure has the substantial advantage that a large number of samples (e.g. 60 samples) can be measured in one single measurement cycle without human monitoring. A measuring cycle can therefore easily be carried out overnight and during the weekend.

The conventional actuators 34 (see FIG. 4) each contain at least one drive unit which normally consists essentially of an electrical motor. The actuator is not positioned too close to the magnet, since the ferromagnetic and permanent magnetic components of the motor would negatively influence the homogeneity of the $H_0$-field of the magnet. In addition, large electromagnetic forces can occur between the magnet coil and the motor which could critically load not only the magnet/dewar-system but also the motor. Not the least of all, these electric motors loose effectiveness in high fringe fields. For these reasons, the electric motors which are located in the conventional actuator 34 are disposed at a relatively large separation from the magnetic center 32 of the magnet and are connected to the adjustment rods, 8a, 8b, 8c of the probe head via long connection rods 33 consisting essentially of either individual jointed shafts or individual flexible mechanical shafts. A rather cumbersome assembly thereby results which blocks space in the region below the magnet i.e. in a region which, for technical reasons, is in any event limited and offers little freedom of motion to the user.

In contrast thereto it is the purpose of the present invention to improve a probe head having an actuator of the above mentioned kind in such a fashion that it provides more freedom of motion and comfort below the magnet to the user by minimizing space requirements for the actuator and optimizing access to the vicinity below the magnet. Another purpose of the invention is to simplify installation of the actuator. In conventional actuators, the user must recouple the actuator connection rods to the probe head after each probe head change. This should no longer be required with a probe head having actuators in accordance with the invention.

SUMMARY OF THE INVENTION

This purpose is achieved in accordance with the invention with the initially apparently unrealistic concept of integrating the actuator directly into the probe head of the NMR spectrometer, i.e. to place it directly proximate to the magnetic center. This would initially seem inappropriate, since the amount of room in the region of the probe head is very limited, since one or more electrical motors must work reliably in a relatively high fringe field of the NMR magnet, and since the $H_0$-field of the magnet at the location of the sample may be excessively influenced. These are conditions which render realization of the concept in accordance with the invention unlikely when first examined by one of average skill in the art. It is therefore not surprising that up to this point in time, this concept has not been enacted, although actuators for NMR-probe heads have been known in the art for more than six years and miniaturized components, e.g. motors, transmissions, etc. for an even longer period of time.

The key concept for realizing the idea in accordance with the invention is a systematic miniaturization of the probe head actuator as well as an optimization of the performance of the drive unit in high fringe fields.

An embodiment of the actuator probe head in accordance with the invention is highly preferred with which the drive unit comprises one or more miniaturized DC-motors to produce torque.

An extreme miniaturization of the most troublesome components, namely the electric motor in the drive unit, facilitates a strong reduction of its influence on the $H_0$-field. If the mass of the ferromagnetic and permanent magnetic material proximate the magnet is kept small then its influence on the homogeneity of the magnet is also small. Expressed in another way: if the entire mass of the ferromagnetic and permanent magnetic material is reduced then it is also possible for these materials to be closer to the magnet. An extremely small electric motor e.g. a miniature motor can therefore be mounted directly to the lower part of the probe head without too strongly influencing the $H_0$-field at the location of the sample. In addition, the miniaturization is also necessary for integration of the actuator into the probe head to be at all possible.

An improvement in the above described embodiment is particularly advantageous with which the miniaturized DC-motors have integrated miniature transmissions to effect particularly compact drive and transmission units.

Such miniature motors having sufficiently large torques are commercially available as direct-current (DC) motors having dimensions on the order of 7 mm by 20 mm (without transmission) and 7 mm by 30 mm (with transmission) and deliver a torque of approximately 0.035 Nm (with transmission). An internal stator comprises a cylindrically shaped permanent magnet (e.g. alnico) whose field return is effected through an outer steel cylinder. An intermediate rotor has a commutator comprising a copper winding and is iron-free.

Experiments have shown that even a plurality of such miniaturized motors (see FIG. 3) can be attached to the lower portion of the probe head without excessively influencing the $H_0$-field at the location of the sample.

Additional experiments have shown that these miniaturized motors function well in the fringe field of actively shielded NMR-magnets as long as the field in the center of the magnet does not exceed approximately 10 Tesla. These motors also function well in the fringe field of non-actively shielded NMR-magnets, up to a field of approximately 7 Tesla at the magnet center.

If these limiting values are substantially exceeded, the performance of the miniaturized motor deteriorates to an increasing extent. This behavior can also be observed with normal electrical motors and had led to the understandable opinion that electric motors, precisely due to their manner of operation, cannot be operated in high fringe fields. It was, however, not previously known that the reduced performance is, in particular, due to friction in the bearings and only to a lesser extent due to actual operation of the motor. This is, in combination with the influence on the $H_0$-field, an additional reason why electric motors were not used in high fringe fields in NMR-applications.

The friction in the bearings of the miniaturized motors is due to the fact that the motor axle and the associated transmission, which are normally made from steel, are strongly pushed against the guiding friction bearing by the strong magnetic forces to cause additional friction at this location. The low torque of the miniature motor is then no longer sufficient to overcome this friction. However, if these axles are made from materials that are substantially non-magnetic but which, nevertheless, have high mechanical strength (e.g. bronze alloys) than this problem can also be solved.

After the friction problem is solved, new problems occur which have to do with the manner of operation of an electrical motor. The fringe field of the NMR-magnet has an influence on the magnetic state within the motor and can thereby deteriorate its performance. The orientation of the permanent magnets in the motor relative to the fringe field of the NMR-magnet should therefore be chosen in such a fashion that motor function is optimized. Towards this end, two physical properties are important. First, the magnetic field within the permanent magnets and the field in the air gap of the motor are oppositely directed. In addition, the fringe field of the NMR-magnet tends to weaken the permanent magnets when the fringe field is directed in opposition to the field within the permanent magnets and when the coercive force of the permanent magnet is small. If the field strength in the fringe field is small compared to the coercive force of the permanent magnet then the fringe field has practically no influence on the permanent magnet. In this case, the fringe field and the field in the air gap of the permanent magnet should be oriented, to the extent possible, in the same direction so that the field in the air gap and the associated torque is increased.

If, in contrast thereto, the field strength of the fringe field is comparable to the coercive force of the permanent magnet, then the orientation to the motor should be chosen in such a fashion that the fringe field of the NMR-magnet supports the field within the permanent magnet, i.e. has substantially the same direction. One therefore prevents a weakening of the permanent magnets but contributes on the other hand to a weakening of the field in the gap of the motor and therefore to a reduction in the torque. If, however, the permanent magnets were weakened instead of the air gap, this would result in a much stronger reduction in the torque.

With magnets having $B_0>11$ Tesla, very high fringe fields can occur which are comparable to or larger than the coercive force of the magnet. In this case, it is no longer reasonable to use motors having permanent magnets, since the weakening of the field in the air gap of the motor would be too large. In this case, it is more reasonable to use the fringe field of the NMR-magnet itself to drive the motor. The miniature motors then consist essentially of only various copper windings on a rotor as well as a commutator.

The maximum torque of these miniature motors is, of course, limited. Through a reduction in the original revolution speed with the assistance of a transmission, the torque can be increased at the expense of a slower adjustment speed. On the other hand, the integration of the actuator into the probe head has the advantage that no direction changing shaft connections or flexible shafts are required. The latter require larger torques the further the actuator is disposed from the probe head. This is one of the reasons why the relatively small torque of the miniature motors is sufficient for the present application.

An embodiment of the actuator probe head in accordance with the invention is also advantageous with which the transmission unit has a beveled gear wheel transmission as well as a drive shaft rotated by 90° with respect to the shaft of the corresponding drive unit. In this manner, the drive unit can be disposed at the side of the vertical axis of the NMR-assembly so that the small amount of space below the usual NMR-cryostat can be better utilized. Assembly of the actuator is also thereby simplified. In addition, proper utilization of beveled gear wheels in the beveled wheel drive can lead to the proper gear ratios and associated rotational velocity transformation between the drive motor and the adjustment rods operated thereby.

In an additional preferred embodiment, the drive shaft has a sliding clutch. In this manner, excessive torques and resulting damage to the probe head region are avoided.

A particularly simple and therefore rapid assembly in the probe head is facilitated by an embodiment of the probe head actuator in accordance with the invention with which the drive shaft can independently latch into the adjustment rods.

The miniaturization of the actuator and its integration into the probe head leads to a reduction in manufacturing costs. Since these miniature motors and their associated transmissions have wide ranges of application, they are mass-produced and are therefore relatively inexpensive. Each probe head can therefore have its own actuator without having the costs be excessive. The exchange of probe heads while maintaining a remote controlled resonance and impedance matching is thereby extremely simple and elegant to carry out with the actuator in accordance with the invention.

Even when only one single actuator in accordance with the invention is available so that a probe head change requires an assembly of the actuator onto the new probe head, substantial advantages of the probe head in accordance with the invention compared to conventional drive mechanisms are, nevertheless, present. The disassembly and assembly no longer needs to be done, with extreme difficulty, below the NMR-magnet, rather disassembly and assembly can be easily effected on a table with the assembled system subsequently being introduced as a complete unit into the NMR-magnet.

Further advantages of the invention can be derived from the description and the drawing. The above mentioned features and those to be further described below can be utilized in accordance with the invention individually or collectively in arbitrary combination. The embodiments shown and described are not to be considered exhaustive enumeration, rather have exemplary character for illustrating the invention.

The invention is shown in the drawing and is described more closely with reference to the embodiments.

BRIEF DESCRIPTION OF THE DRAWING

FIG. 1a shows a schematic side view of an NMR-probe head;

FIG. 1b shows an actuator in accordance with the invention suitable for an NMR-probe head according to FIG. 1a;

FIG. 1c shows the NMR-probe head according to FIG. 1a with installed actuator according to FIG. 1b;

FIG. 1d shows the assembly in accordance with FIG. 1c complemented by an electronic control unit;

FIG. 2a shows an enlarged schematic vertical partial cut through the assembly in accordance with FIG. 1c;

FIG. 2b shows a side view of the transmission component shown in FIG. 2a;

FIG. 3 shows a horizontal cut view from above of the drive and transmission units according to FIG. 2a.

DESCRIPTION OF THE PREFERRED EMBODIMENT

Figures 2A, 2B:
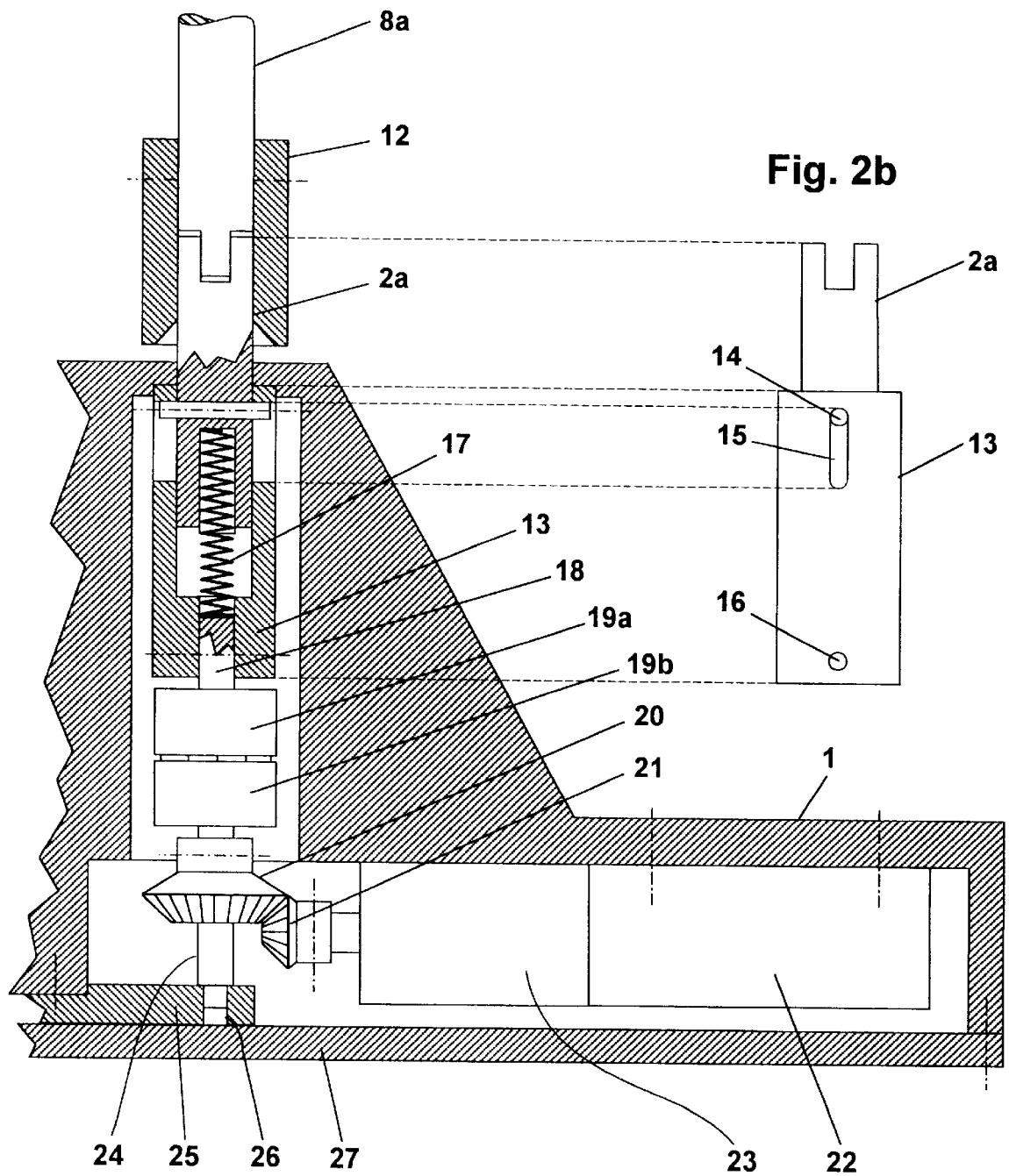

FIG. 1a shows an NMR-probe head consisting essentially of a lower portion 6 and an upper portion 7. An RF cable 9a can be seen in the lower portion with which the connections between the NMR-receiver coils, including their adaptive network, to the RF-output sockets 9b are established. The NMR-signal is passed from the RF-output socket 9b via RF cable 35 to preamplifiers 36 (see FIG. 4) which are generally disposed somewhat outside of the fringe field of the NMR-magnet. The adjustment rods 8a, 8b and 8c, seen in the lower portion 6, are used to adjust the capacitances for resonance and power matching. Three such adjustment rods are shown, but more or less can be utilized.

Figure 3:
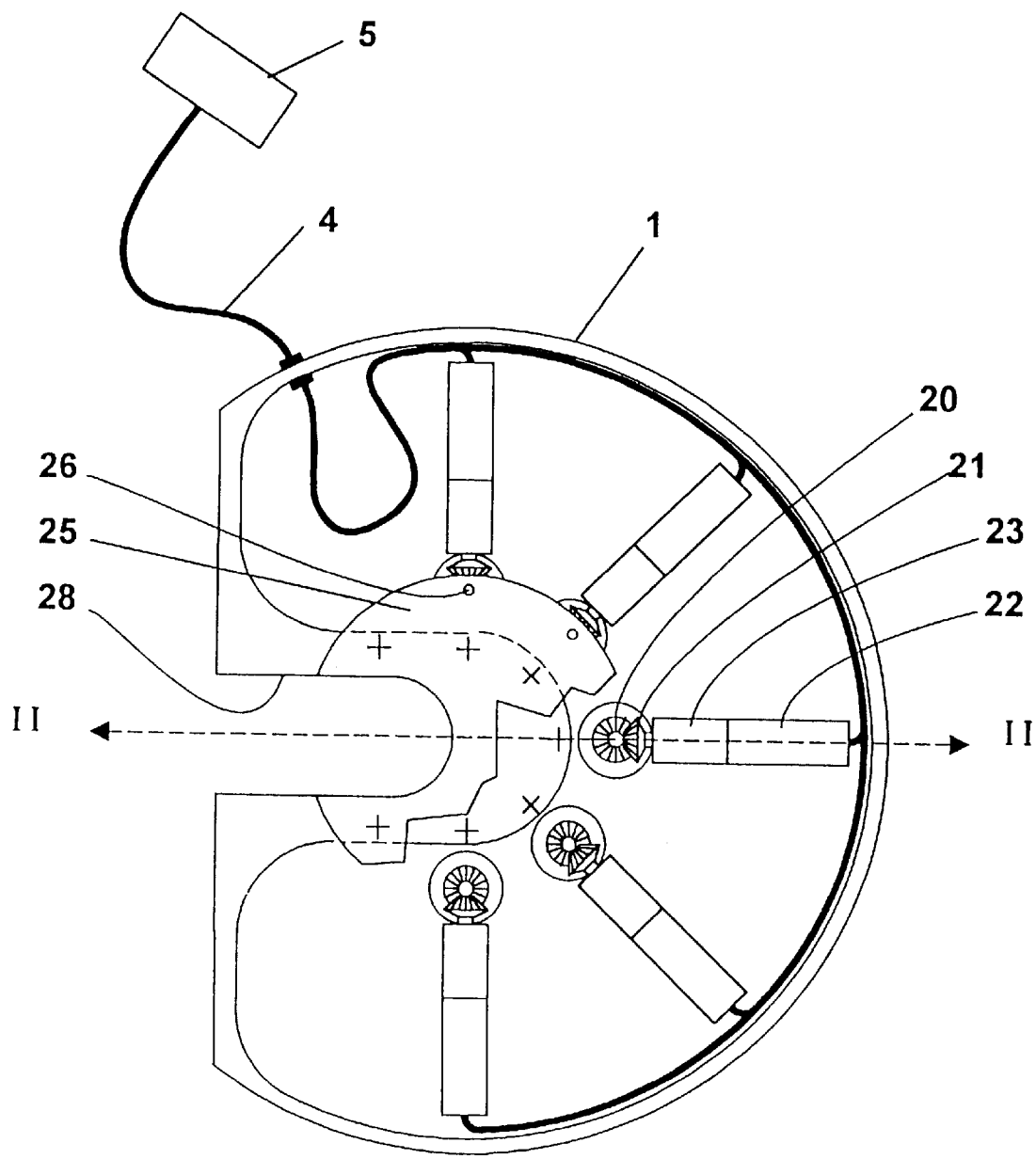

FIG. 1b shows an embodiment of the actuator 1 in accordance with the invention having a plurality of internal miniature motors (see FIG. 3). Drive shafts 2a, 2b, 2c can be seen on the upper side, wherein each is driven by a separate miniature motor and has a screw-driver-shaped extension on its outer end. These ends fit into the slotted ends of the adjustment rods 8a, 8b and 8c to facilitate a transfer of torque from the drive shaft to the adjustment rods 8a, 8b, 8c.

The electrical energy required by the miniature motor is delivered via a plug 5 and an electric lead 4. The actuator 1 is screwed onto the lower portion 6 of the probe head with the assistance of bolts 3a, 3b (only two of which are shown, the others being covered and not visible).

FIG. 1c shows the actuator 1 screwed onto the lower portion 6 of the probe head, disposed beneath the upper portion 7 of the probe head. The drive shafts 2a, 2b, 2c and the adjustment rods 8a, 8b, 8c are shown in the snapped-in state.

FIG. 1d shows an electronic unit 10 associated with the actuator 1 and disposed beneath the upper portion 7 of the probe head. This unit receives a control command from a computer via socket 11 and converts same into corresponding current values which are passed on to the individual miniature motors. The electrical connection between the miniature motors in the actuator 1 and the electronic unit 10 is effected via cable 4 and plug 5.

FIG. 2a shows a cut through the actuator 1 in accordance with the invention. The transfer of torque from the miniature motor 22 to the drive shaft 2a is effected by means of three components:

1. a multi-stage integrated planetary gear 23 with which the high revolution speed of the motor is reduced and the torque increased;
2. a directional changing transmission comprising the two beveled gear wheels 20 and 21. This transfers the torque from the horizontal to the vertical axis and performs an additional step-down;
3. a sliding clutch 19a, 19b for limiting the maximum torque which can occur during improper operation. In this manner, destruction of the individual parts of the actuator 1 is avoided.

A transfer component 13 (shown in the side view of FIG. 2b) facilitates an automatic snapping-in of the drive shaft 2a and the adjustment rods 8a. This permits, with the assistance of a pin 14 and a slot 15, a transfer of the torque and, with the assistance of a spring 17 and the slot 15, a sufficient amount of play along the axis of the drive shaft 2a. Both these facts lead, first of all, to the transfer of torque and, secondly, to an automatic snapping-in between the slot of the rotating drive shaft 2a and the screw-driver-like extension of the adjustment rod 8a.

A guide bushing 12, mounted to the adjustment rod 8a, serves for simplified positioning of the drive shaft 2a and the adjustment rod 8a. A guide plate 25 is provided with friction bearings 26 to guide the lower section 24 of the drive shaft 18, to which the transfer component 13 is attached by a bolt 16, as well as all other drive axles. The lower region of the actuator is closed by a cover 27.

FIG. 3 shows a view of the actuator 1 from below without cover 27. The cut plane A-A corresponds to the drawing of FIG. 2a. A part of the guide plate 25 having friction bearings 26 is also visible. The actuator contains five miniature motors but could have more or less. The two beveled gear wheels 20 and 21, the miniaturized multi-stage integrated planetary gear 23 as well as the motor 22 can be seen in the drawing. The electrical connections to the individual motors are combined in cable 4 which, in turn, is connected to plug 5.

A slot 28 provides the necessary space for mounting the transfer-dewar connecting the lower part 6 of the probe head to the lower part of the receiver coils. This transfer-dewar is part of the temperature control unit 38 (see FIG. 4) with which the NMR-probe head can be brought to differing temperatures.

Figure 4:
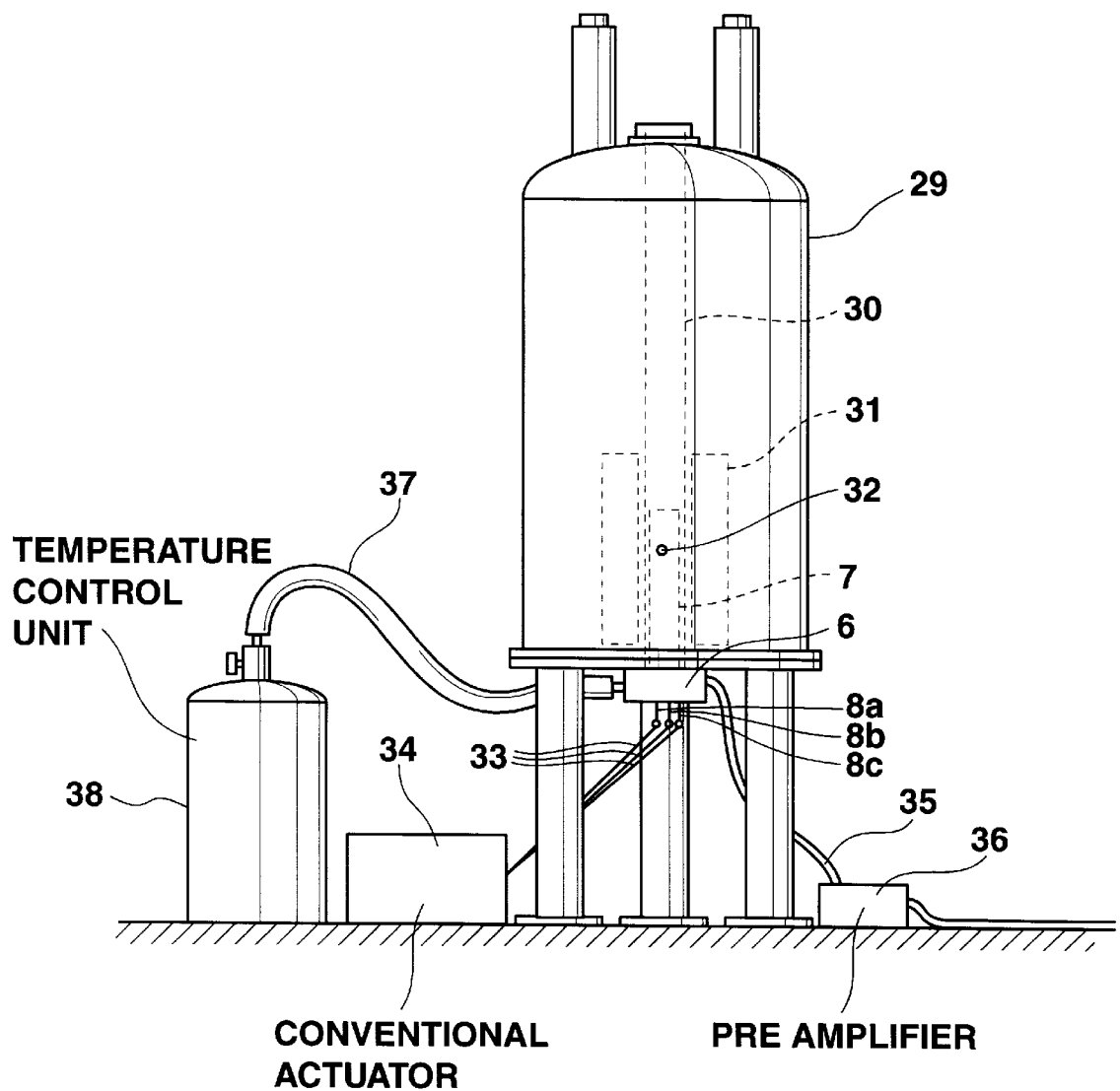
FIG. 4 shows a schematic partially transparent side view of an NMR-spectrometer of prior art.

FIG. 4 illustrates the prior art. A superconducting NMR magnet 31 is located within a cryostat 29. The cryostat 29 has a room temperature vertical through-bore 30, usually having a diameter of approximately 5 cm, and a probe head, comprising a lower portion 6 upper portion 7, is located in the bore 30 in such a fashion that the center of the NMR-receiver coil coincides with the center of magnet 31 and is defined by a point 32. The adjustment rods 8a, 8b, 8c are located on the lower portion 6 of the probe head and are connected to a conventional actuator 34 via a connection rod 33. The connection rod 33 transfers the torque produced in the actuator 34 to the adjustment rods 8a, 8b, 8c.

The radio frequency NMR-signal is passed from the lower portion 6 of the probe head via an RF-connection cable 35 to the preamplifiers 36. In addition, a thermally insulated and flexible connecting tube 37 communicates with the lower portion 6 of the probe head and the temperature unit 38 for guiding a cooling or warming gas (normally nitrogen) from the temperature unit 38 to the probe head. The gas then gains access to the sample via a glass dewar mounted in the probe head.

FIG. 4 clearly shows that the region below the NMR-magnet 31 is blocked by a plurality of devices, in particular the connection rods 33, to impede free access to the probe head.

We claim:

1. A nuclear magnetic resonance (NMR) spectrometer probe head with remote control adjustment of probe head electrical and/or mechanical units, the probe head comprising:

a probe head lower portion;

radio frequency spectrometer resonant circuit means mounted said probe head;

at least one adjustment rod communicating with said resonant circuit means for tuning said resonant circuit means;

a drive unit;

a transmission unit connected to said drive unit;

a drive shaft coupled between said transmission unit and said adjustment rod; and means for directly mounting and fastening said drive unit, said transmission unit and said drive shaft to said probe head lower portion during operation of the NMR spectrometer.

2. The probe head of claim 1, wherein said drive unit comprises a miniaturized DC-motor to produce torques.

3. The probe head of claim 2, wherein said miniaturized DC-motor comprises an integrated miniaturized transmission.

4. The probe head of claim 2, wherein said miniaturized DC-motor operates in a fringe field of the NMR-magnet which is smaller than a coercive force of a permanent magnet acting as stator for said DC-motor and wherein a magnetic field in an air gap of said motor has substantially the same direction as the fringe field at a location of said air gap.

5. The probe head of claim 2, wherein said miniaturized direct current motor operates in a fringe field of an NMR-magnet which is comparable to a coercive force of a permanent magnet acting as stator for said direct current motor and wherein a field within said permanent magnet is oriented substantially in a same direction as the fringe field at a location of said permanent magnet.

6. The probe head according of claim 2, wherein said miniaturized direct current motor does not have a permanent magnet, rather uses a fringe field of an NMR-magnet as a stator field.

7. The probe head of claim 1, wherein said transmission unit comprises beveled gear wheel drives and said drive shaft is rotated by 90° with respect to a shaft of said drive unit.

8. The probe head of claim 1, further comprising a sliding clutch cooperating with said drive shaft.

9. The probe head of claim 1, wherein said drive shaft automatically snaps into said adjustment rod.

* * * * *